US006812646B2

(12) United States Patent
Windhorn et al.

(10) Patent No.: US 6,812,646 B2
(45) Date of Patent: Nov. 2, 2004

(54) METHOD AND DEVICE FOR ATTENUATING HARMONICS IN SEMICONDUCTOR PLASMA PROCESSING SYSTEMS

(75) Inventors: Thomas H. Windhorn, Mesa, AZ (US); Andrej S. Mitrovic, Phoenix, AZ (US); Wayne L. Johnson, Phoenix, AZ (US)

(73) Assignee: Tokyo Electron Limited, Tokyo (JP)

(*) Notice: Subject to any disclaimer, the term of this patent is extended or adjusted under 35 U.S.C. 154(b) by 216 days.

(21) Appl. No.: 10/218,036

(22) Filed: Aug. 14, 2002

(65) Prior Publication Data

US 2003/0057844 A1 Mar. 27, 2003

Related U.S. Application Data

(63) Continuation of application No. PCT/US01/04135, filed on Feb. 9, 2001.
(60) Provisional application No. 60/182,187, filed on Feb. 14, 2000.

(51) Int. Cl.[7] ................................................. H01J 7/24
(52) U.S. Cl. ............................. 315/111.21; 315/111.51; 156/345; 118/723 I
(58) Field of Search .................. 315/111.01, 111.21, 315/111.51, 111.81; 156/345, 345.43, 345.44; 118/723 E, 723 I, 723 MA, 723 MP, 723 MR, 723 MW

(56) References Cited

U.S. PATENT DOCUMENTS

| | | | |
|---|---|---|---|
| 5,302,882 A | 4/1994 | Miller | 315/111.21 |
| 5,325,019 A | 6/1994 | Miller et al. | 315/111.21 |
| 5,961,773 A * | 10/1999 | Ichimura et al. | 156/345 |
| 6,347,602 B2 * | 2/2002 | Goto et al. | 118/723 MW |
| 6,631,693 B2 * | 10/2003 | Hilliker | 118/723 E |
| 2002/0100422 A1 * | 8/2002 | Hilliker | 118/723 I |

FOREIGN PATENT DOCUMENTS

| | | |
|---|---|---|
| GB | 2 012 097 | 7/1979 |
| WO | WO 93/21685 | 10/1993 |

* cited by examiner

Primary Examiner—Don Wong
Assistant Examiner—Jimmy T. Vu
(74) Attorney, Agent, or Firm—Pillsbury Winthrop LLP

(57) ABSTRACT

A system and method for maintaining a plasma in a plasma region, by supplying RF power at a fundamental frequency to the plasma region together with a gas in order to create an RF electromagnetic field which interacts with the gas to create a plasma that contains electromagnetic energy components at frequencies that are harmonics of the fundamental frequency. The components at frequencies that are harmonics of the fundamental frequency are removed from the plasma by placing a body of an RF absorber material in energy receiving communication with the plasma, the body having a frequency dependent attenuation characteristic such that the body attenuates electrical energy at frequencies higher than the fundamental frequency more strongly than energy at the fundamental frequency.

22 Claims, 6 Drawing Sheets

METHOD AND DEVICE FOR ATTENUATING HARMONICS IN SEMICONDUCTOR PLASMA PROCESSING SYSTEMS

This application is a Continuation of International Application PCT/US01/04135, filed on Feb. 9, 2001 and claims the benefit of U.S. Provisional Application 60/182,187, filed Feb. 14, 2000, the contents of both of which are hereby incorporated by reference.

BACKGROUND OF THE INVENTION

The present invention relates to plasma processing systems, and particularly to the delivery of RF power to initiate and sustain a plasma in such systems.

In the semiconductor fabrication industry, capacitively coupled plasma sources are widely used for dry etching and plasma enhanced chemical deposition. Dry etching is a process for removing a layer of material from a wafer surface. This removal is a result of combined mechanical and chemical effects of high-energy plasma ions striking the wafer surface. In plasma enhanced chemical deposition, a layer of a material is deposited on the wafer surface. This material is introduced into the plasma either by sputtering a target made of the material or by supplying a gas which contains the material or from which the material is produced by a chemical reaction. The material may be ionized by the plasma and can then be attracted to the wafer by an electric field.

The trend in the semiconductor fabrication industry has been toward integrated circuits having ever smaller elemental features. As a result, etch and deposition rate uniformity over the wafer surface has become more important, particularly when a layer is being etched or deposited according to a pattern. At the same time, recent developments in plasma source technology have led to the increased use of very high frequency RF excitation, e.g. from 60 to 300 MHz, and possibly even higher, to initiate and sustain the plasma.

The use of these very high excitation frequencies provides a benefit in the form of increased power coupling to the plasma, and thus excitation efficiency, that is likely caused by an increase of plasma electron temperature. This increase of RF power coupling and thus plasma density, has the effect of increasing harmonic generation in the plasma. However, maintaining high etch and deposition rate uniformity levels at these very high excitation frequencies and with strong harmonics present has proven to be a difficult feat, for a number of reasons.

For example, as the plasma RF excitation frequency is increased, the wavelength of the RF wave decreases. Thus, RF electromagnetic field spatial variations are more pronounced at these higher frequencies and this adversely affects process uniformity. In addition, another trend in the industry is to process ever larger wafers, 300 mm diameter wafer technology presently being implemented. Of course, as wafer diameter increases, the wavelength-to-wafer-diameter ratio decreases.

A plasma acts as a nonlinear RF circuit element and thus acts as a source of harmonics of the fundamental excitation frequency. These harmonics, due to their higher frequencies, have an even higher power coupling efficiency to the plasma than the fundamental. Therefore, harmonics, even if present at very low power levels, can significantly affect process uniformity due to their very unfavorable wavelength-to-wafer-diameter ratio.

Since harmonics of the RF fundamental excitation frequency have comparatively short wavelengths, they are far more likely to set up resonances in various places in the process chamber, RF transmission lines, cavities, etc., since their half-wavelengths are comparable to the dimensions of these places.

The situation is further worsened by the use of components made of high permittivity ($\in$) and/or permeability ($\mu$) materials, or by the presence of RF transmission structural features that have significant series inductance (L) and/or shunt capacitance (C). Both of these effects reduce the wavelength of the propagating electromagnetic wave in a structure, the former by directly changing the wave propagation velocity, the latter by creating a "slow-wave" structure. This wavelength reduction allows harmonics to resonate in places where they normally would not be able to.

It can thus be seen that reduction of the power content of the harmonics of the RF excitation frequency would improve etch or deposition uniformity. This harmonic attenuation can take place wherever a suitable impedance-matched coupling structure is present, or can be provided, to couple the harmonic power out of the plasma.

This application is a Continuation of International Application PCT/US01/40073, filed on Feb. 9, 2001 and claims the benefit of U.S. Provisional Application 60/182,188, filed Feb. 14, 2000. In the past, various techniques have been proposed for selective attenuation of harmonic frequencies created in plasma processing systems. These techniques utilize either a low-pass filter or a trap circuit. Examples of Patents disclosing such techniques include U.S. Pat. No. 5,302,882 entitled LOW-PASS FILTER FOR PLASMA DISCHARGE, and U.S. Pat. No. 5,325,019 entitled CONTROL OF PLASMA PROCESS BY USE OF HARMONIC FREQUENCY COMPONENTS OF VOLTAGE AND CURRENT.

BRIEF SUMMARY OF THE INVENTION

It is a primary object of the present invention to reduce the power levels of harmonics of the fundamental frequency of the RF excitation power in plasma processing systems.

The above and other objects are achieved, according to the present invention, by a plasma processing system composed of a chamber enclosing a plasma region, a source of RF power having a fundamental frequency and means for transmitting the RF power from the source into the plasma region for establishing an RF electromagnetic field which interacts with a gas in the plasma region to create a plasma. An energy absorbing member that includes a body of an RF absorber material is disposed in energy-receiving communication with the plasma region. The RF absorber material has a frequency dependent attenuation characteristic such that the RF absorber material attenuates electrical energy appearing in the plasma at frequencies higher than the fundamental frequency more strongly than energy at the fundamental frequency.

Objects according to the invention are also achieved by method for maintaining a plasma in a plasma region, which method includes supplying RF power at a fundamental frequency to the plasma region together with a gas in order to create an RF electromagnetic field which interacts with the gas to create a plasma that contains electromagnetic energy components at frequencies that are harmonics of the fundamental frequency, and removing those components from the plasma, wherein the step of removing is carried out by placing a body of an RF absorber material in energy-receiving communication with the plasma, the body having a frequency dependent attenuation characteristic such that the body attenuates electrical energy appearing in the plasma at frequencies higher than the fundamental frequency more strongly than energy at the fundamental frequency.

DETAILED DESCRIPTION OF THE INVENTION

Figure 1:
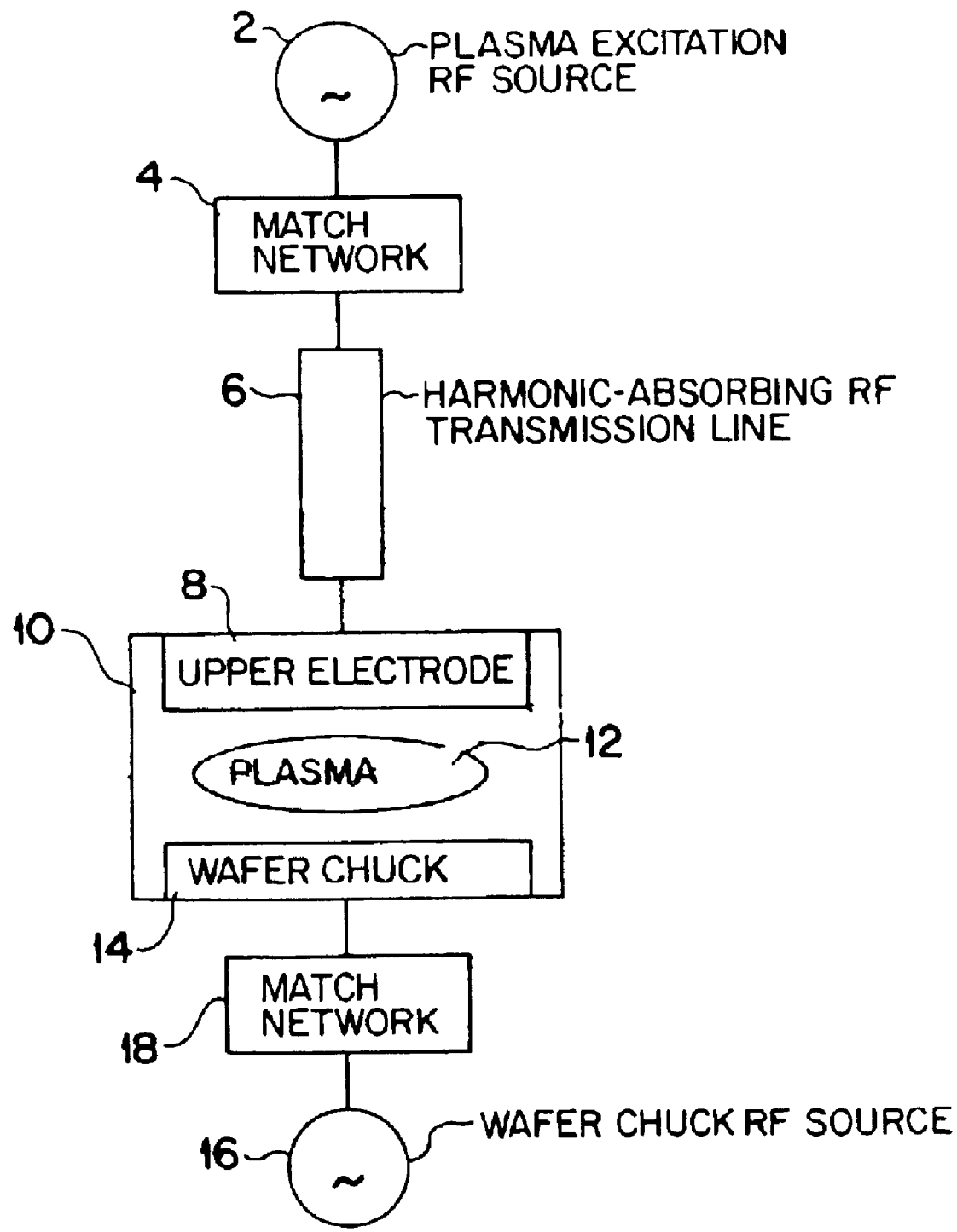
FIG. 1 is a schematic pictorial diagram illustrating the basic components of a plasma processing system provided with a device according to the present invention.

A plasma processing system of the type to which this invention is applied includes a chamber which encloses a plasma region filled with a suitable ionizable gas, such as argon, and into which RF electromagnetic energy is coupled. The energy interacts with the gas to initiate and sustain a plasma. According to the invention, one or more components are provided to preferentially attenuate the energy contained in harmonics of the fundamental frequency of the RF energy coupled into and out of the plasma.

A typical RF transmission line has a wave propagation structure filled with dielectric material. This material typically has low RF loss. Therefore, as electromagnetic energy propagates along the line, only a small fraction of the transmitted RF energy is converted into heat. Preferred embodiments of the invention employ a special class of dielectric materials, so-called "RF absorbers" to load the, or each, transmission line which delivers RF electromagnetic energy to the plasma. These materials are typically composite materials designed to pass certain frequencies of the electromagnetic spectrum with low loss, just like normal low-loss dielectrics, and to strongly attenuate higher frequencies. If an RF absorber material is used that has high attenuation in the range of frequencies spanned by the stronger harmonics of the electromagnetic wave energy in the plasma and low attenuation of energy at the fundamental RF excitation frequency, selective attenuation of harmonics can be achieved with all the aforementioned benefits.

Examples of RF absorber materials having this property are members of the ECCOSORB® CR castable resin family, marketed by Emerson & Cuming Microwave Products, Inc. of 869 Washington St., Ste. 1, Canton, Mass. 02021. These absorber materials are iron powder loaded epoxy resins and have very low loss at frequencies below 100 MHz, and a progressively higher attenuation as frequency increases beyond this value. The family includes over a dozen types of absorber resins, of varying levels of RF attenuation. One example of an ECCOSORB® material that could be used in the present invention is a castable absorber sold under the product designation CR-117.

RF absorber materials invariably have high real and imaginary values of the relative dielectric constant $\epsilon = \epsilon' + j\epsilon''$. Typically, the imaginary part is specified by means of a dielectric "loss tangent" $\tan \delta_d = \epsilon''/\epsilon'$. For example, the ECCOSORB® CR-124 material has $\epsilon' = 50$, and $\tan \delta_d = 0.2$ at 10 MHz, and $\epsilon' = 30$, and $\tan \delta_d = 0.09$ at 1 GHz. Also, their relative magnetic permeability $\mu'$ and magnetic loss tangent $\tan \delta_m$ values are high (e.g. $\mu' = 6.5$, $\tan \delta_m = 0$ at 10 MHz, and $\mu' = 5$, $\tan \delta_m = 0.45$ at 1 GHz). While it may seem that the loss decreases with frequency by looking just at the dielectric loss tangent, actually the opposite is true—the loss increases dramatically with frequency, because of a frequency term involved.

FIG. 1 shows a schematic of one system configuration which includes a plasma excitation RF source 2 which supplies RF power at a fundamental frequency and a match network 4. An RF absorbing transmission line 6 is connected and located between match network 4 and an upper electrode 8 located at the top of a plasma chamber 10. Plasma chamber 10 encloses a plasma region in which a plasma 12 will be initiated and maintained. A wafer chuck 14 is located at the bottom of the plasma region and is connected to a wafer chuck RF source 16 via a second match network 18. Electrodes 8 and 14 and source 2 form a capacitively-coupled RF plasma source used for performing an etch or deposition operation on a wafer mounted on chuck 14. Source 16 acts primarily to impose a DC self-bias on wafer chuck 14, which self-bias acts to attract ions to the surface of the wafer mounted on chuck 14. Transmission line 6 is located on the main RF feed line to electrode 8.

Unlike RF filters and traps which need to be tuned to exact harmonic frequencies, and which in order to achieve high attenuation need to have a high Q-factor and hence a narrow frequency reject band, RF absorbers of the type disclosed above have very broad absorption bands. Wide absorption bands allow these materials to attenuate side-bands of excitation frequency harmonics and resonances in addition to exact harmonic frequencies themselves.

Transmission line 6 itself can be of any suitable configuration including a coaxial line, microstrip, strip-line, etc., typically determined by other electrical and mechanical requirements. Also, a multitude of transmission lines can be used, each of them loaded with RF absorber material.

Plasma 12 will be excited and maintained by RF electromagnetic wave energy at the fundamental RF frequency which is passed to upper electrode 8 and plasma 12 by match network 4 and transmission line 6. Transmission line 6 is essentially transparent to RF electromagnetic wave energy at that frequency. Plasma 12, in turn, converts some of the energy that it receives at the fundamental frequency into harmonics, and these are coupled back into upper electrode 8 and transmission line 6. Energy at harmonic frequencies is strongly attenuated in the absorber material of transmission line 6, and a significant amount of this energy is dissipated in the form of heat along the length of transmission line 6. The reduction of power at harmonic frequencies results in better electric field uniformity at and below upper electrode 8, and thus better etch and deposition uniformity.

Figure 2:
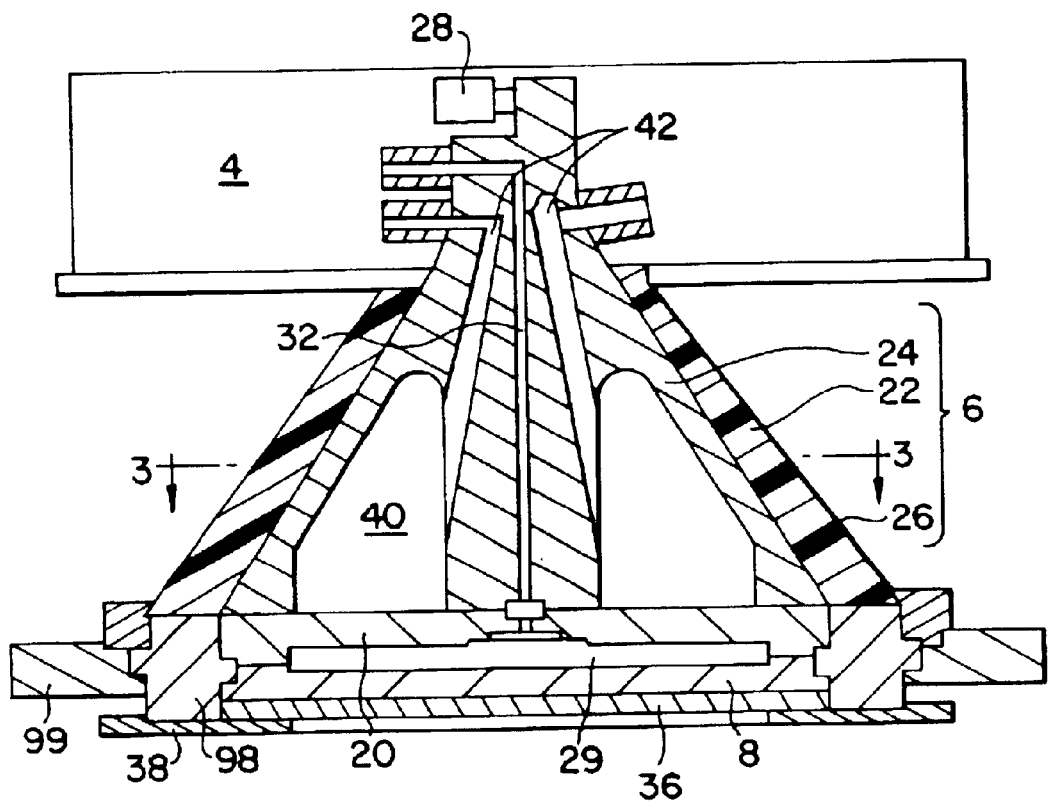
FIG. 2 is a simplified elevational view of one embodiment of a device according to the present invention.
Figure 3:
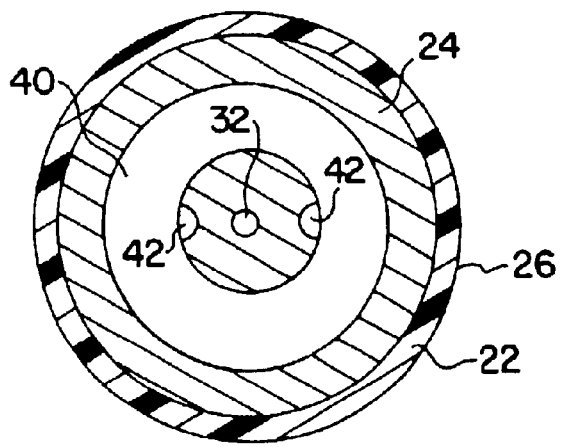
FIG. 3 is a cross-sectional view along line 3—3 of FIG. 2.

FIGS. 2 and 3 show a practical embodiment of an assembly which includes an embodiment of transmission line 6 and electrode 8 of FIG. 1. The transmission line is an absorber-loaded RF transmission line having a frustoconical coaxial geometry. This geometry primarily serves to eliminate discontinuities, and hence reflection points, between match network 4 and electrode 8. Preferably, this transmission line has a constant characteristic impedance, which also helps to minimize reflections.

Transmission line 6 is mounted on a cooling plate 20 which constitutes an upper member of electrode 8. Thus, the electrode is constituted by elements 8, 20. Transmission line 6 includes an absorber body 22 made of RF absorber material having one of the compositions described earlier herein. Body 22 is enclosed by an inner conductor 24 and an outer conductor 26, both made of metal. Outer conductor 26 is made of thin sheet metal. Inner conductor 24 is a monolithic conical block of metal formed to contain a cooling channel and lines, as will be described below. By making the ratio of the outer diameter to the ratio of the inner diameter of transmission line 6 constant and forming body 22 to have a dielectric constant that does not vary along the length of transmission line 6, a constant characteristic impedance is maintained.

In the embodiment shown in FIGS. 2 and 3, electrical insulation is provided between each conductor 24, 26 of the transmission line and the associated body 22 of absorber material. In other embodiments of the invention, to be described below, which are composed of a plurality of transmission lines, electrical insulation is provided between each conductor and the associated body of absorber material of each transmission line.

The insulation may be in the form of a thin polyimide insulating film having a thickness of, for example, the order of 0.001–0.002 in. Since RF absorbers are slightly electrically conductive, this insulation prevents a leakage current from forming between the conductors through the RF absorber body. Such leakage current is undesirable because it is not frequency selective. Thus, the loss inside the RF absorber dielectric is only through RF reactive coupling, i.e., inductive and/or capacitive, and not direct conduction.

Components 20–26 and the above-mentioned cooling channel are all axially symmetrical in this embodiment although they do not necessarily need to be. Body 22 is a conic frustum made of a homogeneous mass of RF absorber material. Outer conductor 26 constitutes a RF ground return terminal. The usual two match network output terminals are connected to inner conductor 24 and outer conductor 26, respectively. This is achieved by mounting a match network output capacitor 28 directly on top of the inner conductor 24. Outer conductor 26 is connected within the enclosure of match network 4, which enclosure serves as a ground conductor.

Upper electrode 8 is of the shower-head type, provided with a plurality of passages (not shown) for delivery of process gas to the plasma region from a plenum 29 enclosed between electrode 8 and cooling plate 20. The plenum is supplied with process gas by a gas feed line 32. Gas feed line 32 is connected to a process gas source and extends along the vertical axis of the frustoconic outline of transmission line 6.

The lower surface of electrode 8, the surface which faces the plasma region, is covered with a shower-head plate 36, i.e., a plate provided with gas passages aligned with passages 30. Plate 36 may be made of material compatible with the chamber process, e.g., doped silicon. Plate 36 acts to prevent sputtering of material from electrode 8. In addition, silicon plate 36 is made of a material compatible with the chamber process, to prevent contamination, and as such acts to separate the plasma from the lower surface of electrode 8. This is particularly advantageous when electrode 8 contains a material that is not chemically compatible with the process.

An alumina dielectric ring insulator 98 serves to extend coax transmission line below RF absorber loaded line 6 and around electrode 8,20. The part of the transmission line constituted by insulator 98 does not absorb any RF and acts as a connection between the plasma and the main conical RF absorbing transmission line 6. Insulator 98 constitutes the dielectric of a coax line whose walls are metallic parts provided by electrode 8, 20 and the chamber structure, a portion of which is shown as element 99. Element 99 is part of the wall of plasma chamber 10 in FIG. 1 and supports the entire transmission line 6, electrode 8,20 and match network 4.

A quartz shield ring 38 is attached around plate 36 and below electrode 8. Quartz shield ring 38 is provided to cover the screws that are used to attach silicon plate 36 to electrode 8, thereby isolating those screws from the plasma environment to prevent process contamination. Electrode 8, plate 36 and ring 38 are all attached to, and supported by, cooling plate 20, which is in turn supported by insulator ring 98, the latter itself being supported by the chamber wall structure 99.

Cooling of the absorber material in body 22 is effected by conduction of heat through inner conductor 24 to a coolant fluid circulated through a cooling channel 40 formed in inner conductor 24. Cooling channel 40 is annular in shape and communicates with a coolant fluid source and a heat exchange element via inlet and outlet cooling lines 42. As noted earlier herein, cooling channel 40 is axially symmetrical. The coolant fluid in channel 40 also acts to cool upper electrode 8.

Match network 4 (details of which are not shown) is mounted on top of transmission line 6, and all cooling and gas feed connections are made within its RF enclosure. Match network 4 can be constructed according to principles well known in the art.

Because of the annular form of transmission line 6, gas and cooling lines need not cross RF absorber body 22, thereby avoiding discontinuities that could act as sources of fringe fields and unwanted higher-order modes of RF propagation.

In addition to configurations involving the insertion of RF absorber material in the main RF feed transmission lines, it is possible to use RF absorber bodies in separately made structures impedance-matched to the plasma that serve the purpose of coupling harmonic power from the plasma, and converting this power into heat. These structures can be inserted wherever this is suitable from both a mechanical and electrical standpoint.

There may be some RF energy at the fundamental frequency reflected back towards match network 4, but match network 4 serves to prevent the reflection from reaching the power supply. Ideally, it would be desirable to have the impedance of the transmission line match that of the plasma, so that there is no reflection and standing wave on transmission line 6. In general, with a fixed transmission line material and geometry, this would be achievable for only one single plasma impedance (e.g. plasma condition). Thus, in most cases, there is a reflected wave on the transmission line 6. This reflection and standing wave can be minimized by appropriate design. While match network 4 cannot prevent this reflection, it will prevent the reflection from reaching the RF, power supply, and thus protects it. The reflection and standing wave are thus confined to transmission line 6 only.

Figure 4A:
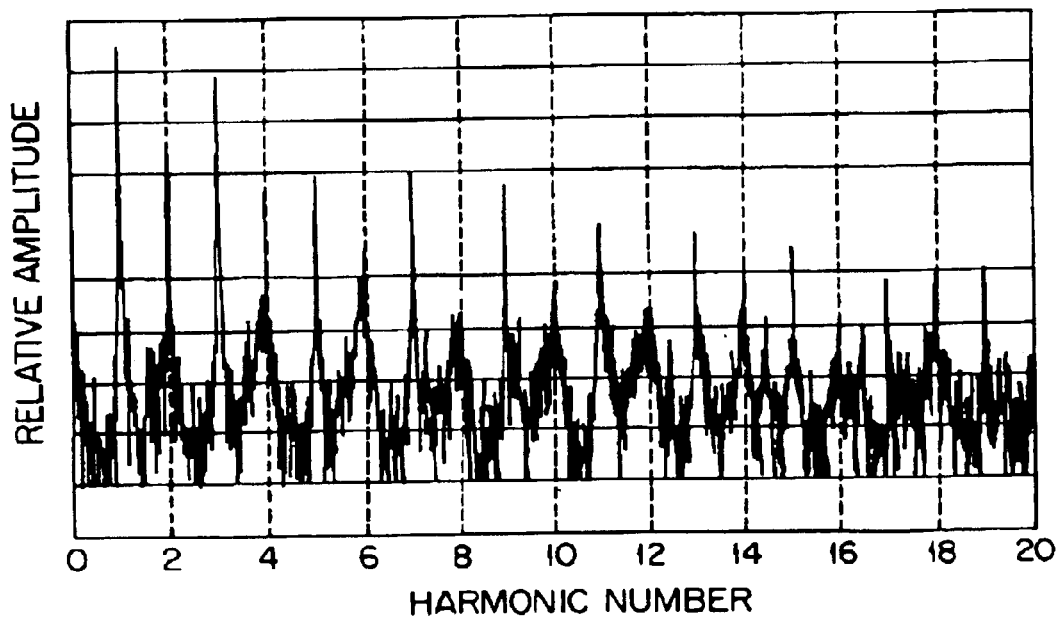
FIGS. 4a and 4b are diagrams comparing RF energy spectra in a plasma according to the prior art (FIG. 4a) and according to the present invention (FIG. 4b).
Figure 4B:
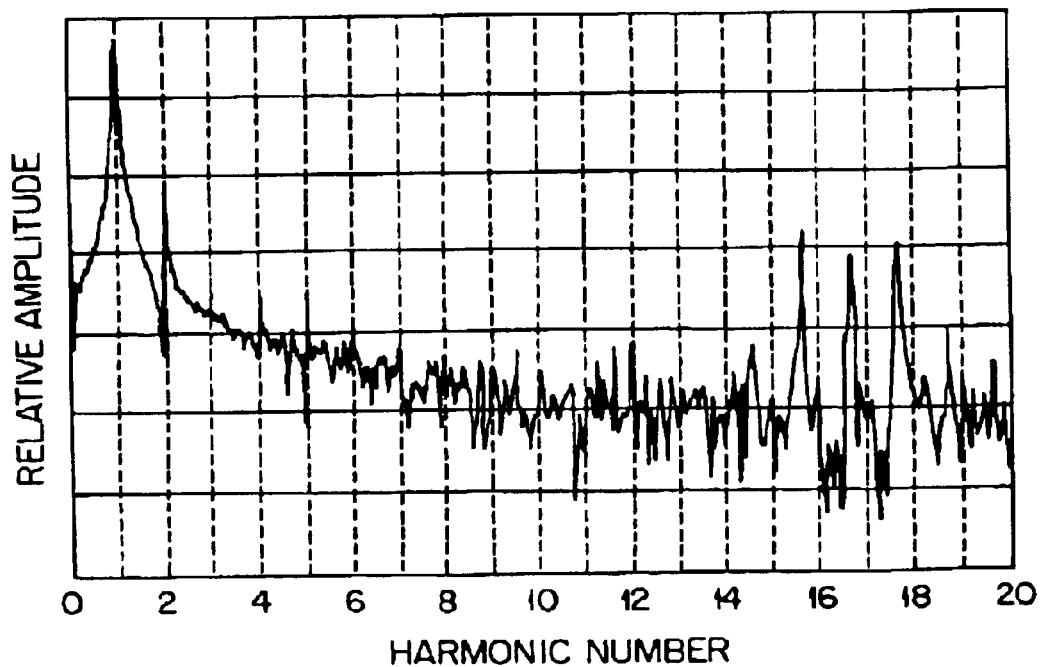

FIGS. 4a and 4b show harmonic spectra measured in the capacitive coupled plasma processing system described above, without (FIG. 4a), and with (FIG. 4b) RF absorber installed in the RF feed line. Harmonics and their sidebands, as well as some resonances, are strongly attenuated by the presence of the RF absorber in the feed line.

According to further embodiments of the invention, an electrode corresponding to electrode 8 can be provided with several RF harmonic absorbing transmission lines, each having a form similar to that of line 6. In addition, wafer chuck 14 can be provided with a similar RF transmission line having a harmonic absorbing structure and harmonic absorbing bodies can be mounted at other places in the chamber where RF energy at these harmonic frequencies can be effectively coupled to the absorbing structure. In other words, RF absorber bodies do not necessarily need to be in an RF transmission line.

Figure 5:
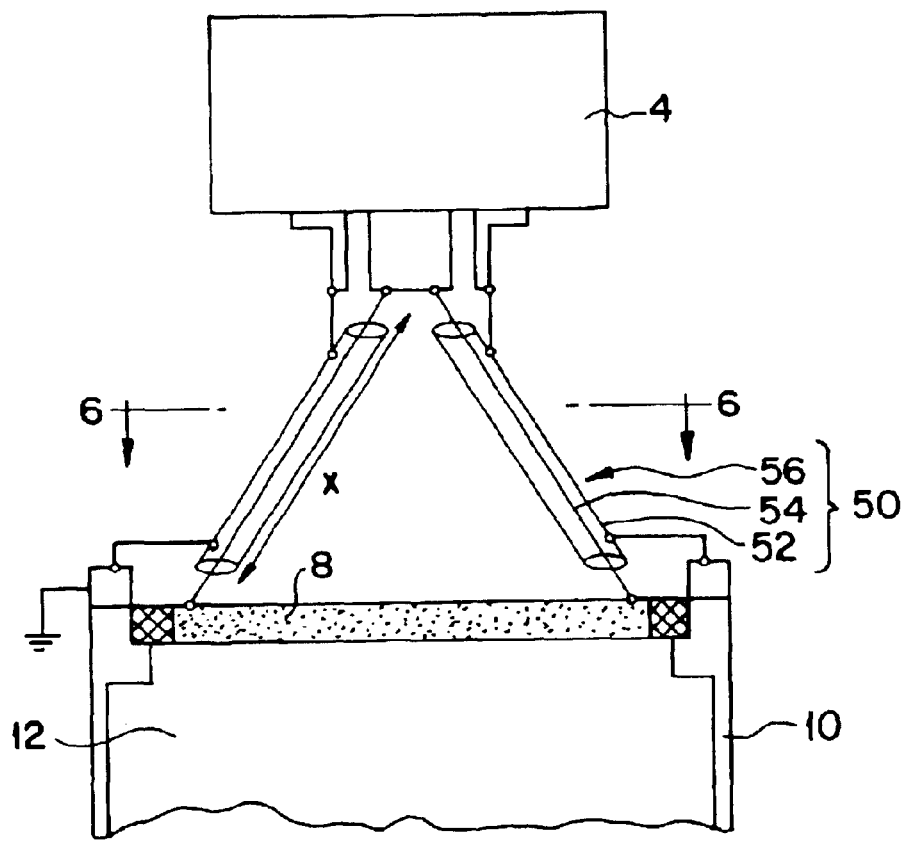
FIG. 5 is an elevational, pictorial view of a second embodiment of a device according to the present invention.
Figure 6:
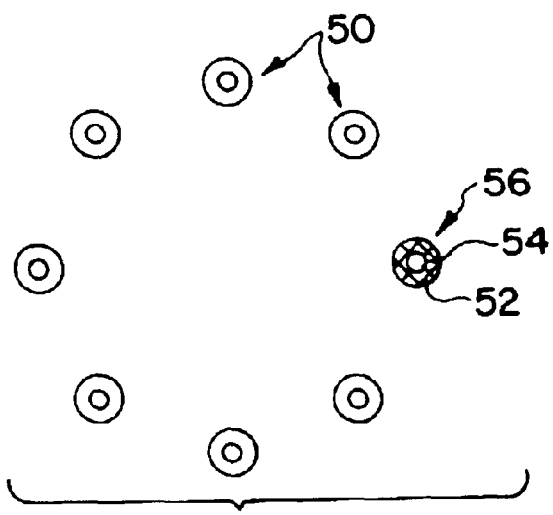
FIG. 6 is a cross-sectional view along line 6—6 of FIG. 5.

FIGS. 5 and 6 show a second embodiment in which a plurality of coaxial RF absorber loaded transmission lines 50 are used to transfer RF power from match network 4 to upper electrode 8 of a capacitively coupled plasma discharge system. All lines 50 are of equal length, x, and a dielectric 52 between inner coaxial conductor 54 and outer coaxial conductor 56 of each line 50 is an RF absorber which may be either homogeneous, or with varying properties along the line, as described above with reference to FIGS. 2 and 3. Inner coaxial conductors 54 of all lines 50 are connected between the same match network output terminal and electrode 8. Outer coaxial conductors 56 of all lines 50 are connected between the same match network output terminal and grounded plasma processing chamber 10 in which plasma 12 is ignited and maintained. As stated earlier herein, each conductor 54, 56 is provided with an insulating film or layer that insulates it from dielectric 52.

Figure 7:
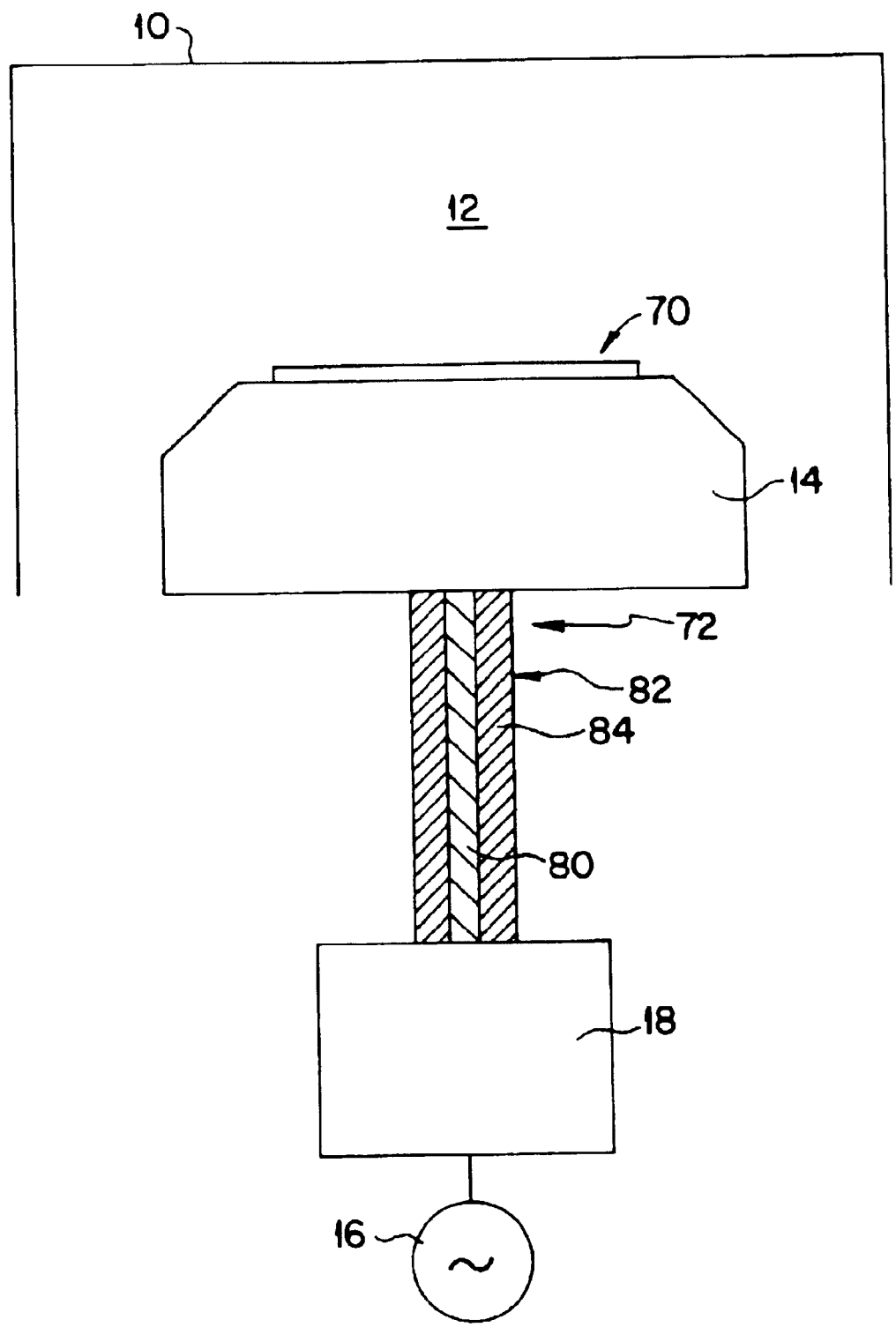
FIG. 7 is an elevational, pictorial view of a third embodiment of a device according to the present invention.

FIG. 7 shows an embodiment in which a coaxial RF feed line 72 is connected between a match network 18 and wafer chuck 14 located within chamber 10. Wafer chuck 14 carries a wafer 70 on which a plasma process is to be performed. RF power is supplied to match network 18 by power source 16. Line 72 is a coaxial transmission line composed of an inner conductor 80, an outer conductor 82 and a dielectric 84 between conductors 80 and 82. According to the invention, all, or part, of dielectric 84 is constituted of RF absorber material of the type described earlier herein to attenuate energy which arises within the plasma at frequencies that are harmonics of the fundamental frequency produced by power source 16 and also all other frequencies in the chamber associated with upper electrode plasma excitation (e.g. fundamental and harmonics of upper electrode 8), and which is conducted to feed line 72 via chuck 14, after being coupled into chuck 14 from the plasma 12.

The absorber in the line 72 can be used to block out interference from the fundamental and harmonics of upper electrode 8 excitation. This makes the operating conditions of chuck match network 18 easier to control (e.g. there is no high frequency interference).

Figure 8A:
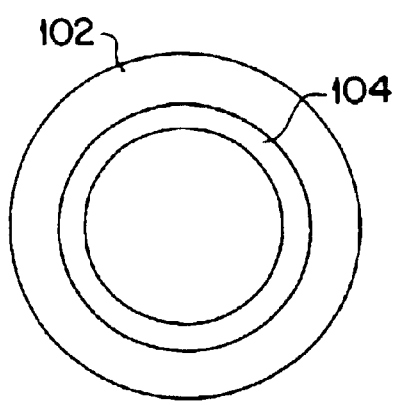
FIGS. 8a and 8b are plan views in planes perpendicular to that of FIG. 2, showing two embodiments of a coax transmission line absorber body with varying grade of dielectric material over the cross section.
Figure 8B:
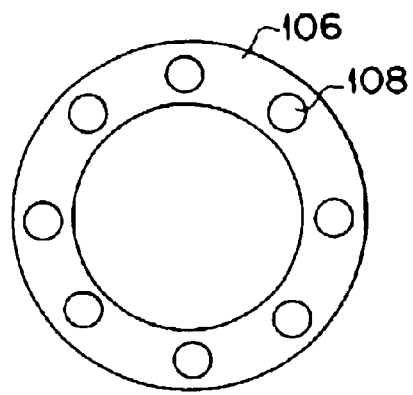

According to further embodiments of the invention, the absorber body of a transmission line can advantageously be made of dielectric material which has a varying dielectric material characteristic, based for example on a varying composition, across the cross section of the transmission line, i.e., in planes perpendicular to the longitudinal axis of the line. FIGS. 8a and 8b show two embodiments of a coax transmission line absorber body with varying grade of dielectric material over the cross section. FIG. 8a shows a dielectric body of a coax transmission line composed of two concentric layers 102 and 104 of absorber material having respectively different grades, such as different loss characteristics. FIG. 8b shows an alternative embodiment composed of a main member 106 constituting the bulk of the body made of one grade of dielectric material. Member 106 is provided at spaced locations around its circumference, with bores that extend along the length of the transmission line, and round rod-like inserts 108 made of a different grade of dielectric material are inserted into the bores.

Both embodiments allow the adjustment of characteristic impedance and loss of the transmission line by replacing individual layers or rod-like inserts. This change of characteristic impedance over the cross section is achieved without changing the diameters b and a of the transmission line, but only by changing parts of the dielectric body. This means that no modification of the transmission line structure is needed to obtain a change of impedance and/or loss, and the outer or inner conductor, or even some layers or the bulk of dielectric can stay the same. This results in cost savings, less spare parts in an inventory and easier maintenance, while still enabling the user to adjust the impedance of the transmission line to best match the load impedance generated by his/her current plasma process.

A substantial amount of heat will be generated by energy absorbed in the absorber dielectric body of a transmission line according to the invention. Therefore, according to a further feature of the invention, cooling of the absorber dielectric body is enhanced by providing coolant flow channels within the body.

Figure 9A:
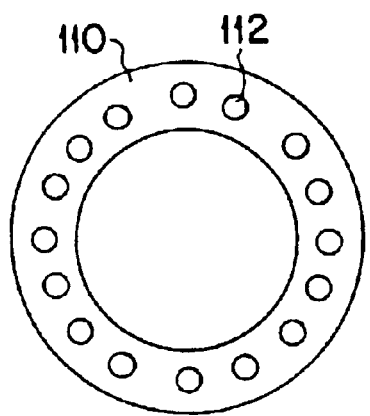
FIGS. 9a and 9b are, respectively, a top plan view and an elevational view showing a further embodiment of a coax transmission line absorber body according to the invention.
Figure 9B:
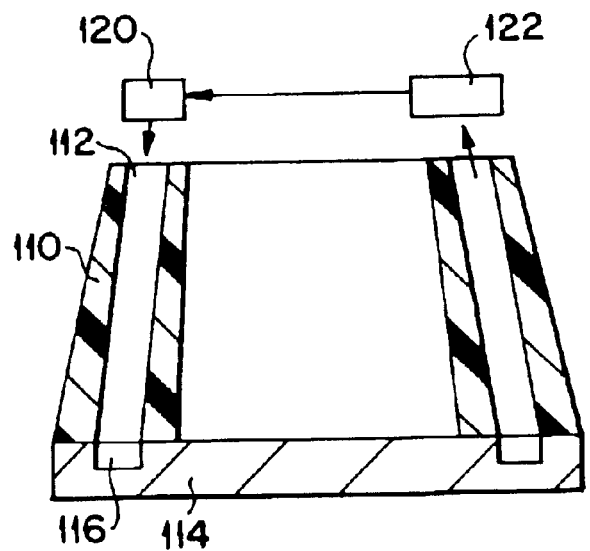

Such an arrangement is shown by way of example in FIGS. 9a and 9b, where an absorber body 110 is cooled directly by passing cooling liquid through channels 112 bored lengthwise though the interior of body 110. In the example illustrated, a plurality of channels 112 are distributed uniformly around the circumference of body 110. Body 110 is mounted on an electrode 114 in the upper surface of which there is provided, for example, grooves, or plenums, 116 for circulating cooling liquid between channels 112. For example, grooves 116 may guide cooling liquid which flows downwardly in one-half of the channels to the remaining channels where it flows upwardly. Cooling liquid is fed to and withdrawn from the upper ends of channels 112 by a cooling liquid circulation system including supply lines 120, discharge lines 122, lines 120 and 122 preferably being made of dielectric material.

An alternative way of feeding cooling liquid is through small holes in the outer conductor and absorber body which lead to cooling channels 112. The rest of the system is the same as in the embodiments described previously.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A plasma processing system comprising:
a chamber enclosing a plasma region;
a system component disposed in said chamber in communication with said plasma region;
a source of RF power having a fundamental frequency; and
means for transmitting the RF power from said source to said plasma region via said system component, said means for transmitting the RF power including an energy absorbing member that includes a body of an RF absorber material disposed in energy-receiving communication with said system component,
wherein said RF absorber material has a frequency dependent attenuation characteristic such that said RF absorber material attenuates electrical energy appearing in the plasma at frequencies higher than the fundamental frequency more strongly than energy at the fundamental frequency.

2. The system of claim 1, wherein said body of RF absorber material forms part of an electrical energy flow path from said system component.

3. The system of claim 2, wherein said means for transmitting the RF power further comprise a matching network connected between said source of RF power and said body of RF absorber material.

4. The system of claim 3, wherein said means for transmitting the RF power and said body of energy absorber material have an annular form.

5. The system of claim 4, wherein said means for transmitting the RF power and said body of energy absorber material have a frustoconical form with a large base directed toward said plasma region.

6. The system of claim 4, further comprising cooling means including a cooling chamber enclosed by said body of energy absorber material for removing heat from said energy absorber material.

7. The system of claim 6, wherein said means for transmitting the RF power further include an upper electrode connected to said energy absorbing member and communicating with the plasma region, and wherein said cooling chamber is located to remove heat from said upper electrode.

8. The system of claim 4, wherein said means for transmitting the RF power and said body of energy absorber material are together constituted by a coaxial transmission line composed of two conductive members between which said body of RF absorber material is disposed.

9. The system of claim 4, wherein said means for transmitting the RF power and said body of energy absorber material are together constituted by a plurality of coaxial transmission lines, each of said coaxial transmission lines being composed of two conductive members between which said body of RF absorber material is disposed.

10. The system of claim 1, wherein said system component comprises a upper electrode, said means for transmitting the RF power are connected to transmit the RF power to said upper electrode for establishing an RF electromagnetic field which interacts with a gas in said plasma region to create a plasma, and said body of RF energy absorber material is disposed between said upper electrode and said source of RF power.

11. The system of claim 1, wherein:
said system component comprises a wafer chuck and said means for transmitting the RF power comprise a coaxial transmission line connected to said chuck;
said transmission line comprises two conductors; and
said body of RF energy absorber material constitutes a dielectric interposed between said two conductors.

12. The system of claim 1, wherein said RF absorber material is a polymer loaded with an electrically conductive powder or fibers.

13. The system of claim 12, wherein the polymer is a resin, plastic, or elastomer material.

14. The system of claim 12, wherein the polymer is an epoxy material.

15. The system of claim 1, wherein said means for transmitting the RF power comprise a transmission line composed of two conductors between which said body of RF energy absorber material is interposed to constitute a dielectric, and two insulating layers each interposed between said body of RF energy absorber material and a respective one of said conductors for electrically insulating said conductors from said body of RF energy absorber material.

16. The system of claim 1, wherein RF power is conducted in a first direction through said body of RF energy absorber material and said body has a dielectric characteristic that varies in value in a cross-sectional direction transverse to the first direction.

17. The system of claim 1, wherein said body of RF energy absorber material comprises: a first body member having a dielectric characteristic with a first value and provided with a plurality of bores; and a plurality of second body members having a dielectric characteristic with a second value different from the first value, said second body members being inserted into said bores.

18. The system of claim 1, wherein said body of RF energy absorber material is a cylindrical body having a plurality of concentric body members each having a respectively different dielectric characteristic value.

19. The system of claim 1, wherein said body of RF energy absorber material is provided with a plurality of cooling liquid flow channels and said system further comprises cooling liquid circulation means coupled to said channels for circulating cooling liquid through said channels.

20. A plasma processing system comprising:
a chamber enclosing a plasma region;
a source of RF power having a fundamental frequency;
an RF power conductor assembly coupling said source of RF power to said plasma region to deliver the RF power into said plasma region where the RF power form an RF electromagnetic field which interacts with a gas in said plasma region to create a plasma; and
an energy absorber member that includes a body of an RF absorber material disposed in energy-receiving communication with said plasma region,
wherein said RF absorber material has a frequency dependent attenuation characteristic such that said RF absorber material attenuates electrical energy at frequencies higher than the fundamental frequency more strongly than energy at the fundamental frequency.

21. A method for maintaining a plasma in a plasma region, comprising:
supplying RF power at a fundamental frequency to the plasma region together with a gas in order to create an RF electromagnetic field which interacts with the gas to create a plasma that contains electromagnetic energy components at frequencies that are harmonics of the fundamental frequency, and
removing those components from the plasma, wherein said removing is carried out by placing a body of an RF absorber material in energy receiving communication with the plasma, the body having a frequency dependent attenuation characteristic such that the body attenuates electrical energy at frequencies higher than the fundamental frequency more strongly than energy at the fundamental frequency.

22. The method of claim 21, wherein the body of RF absorber material is a component of a transmission line for supplying the RF power to the plasma.

* * * * *